US012002658B2

(12) United States Patent
Sonti

(10) Patent No.: US 12,002,658 B2
(45) Date of Patent: Jun. 4, 2024

(54) PROCESS COOLING-WATER ISOLATION

(71) Applicant: Lam Research Corporation, Fremont, CA (US)

(72) Inventor: Sreeram Sonti, Tigard, OR (US)

(73) Assignee: LAM RESEARCH CORPORATION, Fremont, CA (US)

(*) Notice: Subject to any disclaimer, the term of this patent is extended or adjusted under 35 U.S.C. 154(b) by 226 days.

(21) Appl. No.: 17/598,783

(22) PCT Filed: Mar. 26, 2020

(86) PCT No.: PCT/US2020/025048
§ 371 (c)(1),
(2) Date: Sep. 27, 2021

(87) PCT Pub. No.: WO2020/198521
PCT Pub. Date: Oct. 1, 2020

(65) Prior Publication Data
US 2022/0165549 A1 May 26, 2022

Related U.S. Application Data

(60) Provisional application No. 62/825,589, filed on Mar. 28, 2019.

(51) Int. Cl.
*H01J 37/32* (2006.01)
*G01M 3/16* (2006.01)
(Continued)

(52) U.S. Cl.
CPC ....... *H01J 37/32522* (2013.01); *G01M 3/165* (2013.01); *G01M 3/186* (2013.01);
(Continued)

(58) Field of Classification Search
CPC .......... H01J 37/32522; H01J 37/32724; H01J 37/32807; H01J 37/3288; H01J 37/32357;
(Continued)

(56) References Cited

U.S. PATENT DOCUMENTS 7,076,373 B1* 7/2006 Munsterhuis ......... F24H 15/421
702/51
2019/0302859 A1* 10/2019 Fan .................... H05K 7/20818

FOREIGN PATENT DOCUMENTS

CN 113646880 11/2021
JP 2011009353 A 1/2011
(Continued)

OTHER PUBLICATIONS

"International Application Serial No. PCT US2020 025048, International Preliminary Report on Patentability dated Oct. 7, 2021", 8 pages.

(Continued)

*Primary Examiner* — Daryl C Pope

(57) ABSTRACT

In one embodiment, the disclosed apparatus is a process cooling-water isolation system used in a process tool. The system includes an isolation valve coupled between a water supply and an inlet of one or more components in a process-module water-cooling circuit. An open device allows cooling water to flow to the one or more components, while a close device prevents cooling water from flowing to the one or more components. At least one water-leak sensor is coupled to the close device to detect a water leak within the process tool. A check valve having an inlet port is coupled to an outlet of the one or more components, and an outlet port is coupled to a water-return reservoir. The check valve prevents water from back-flowing from the water-return reservoir into the one or more components. Other apparatuses and methods are disclosed.

19 Claims, 4 Drawing Sheets

(51) Int. Cl.
    *G01M 3/18*         (2006.01)
    *G08B 21/20*       (2006.01)

(52) U.S. Cl.
    CPC ........ *G08B 21/20* (2013.01); *H01J 37/32724* (2013.01); *H01J 37/32807* (2013.01); *H01J 37/3288* (2013.01); *H01J 37/32357* (2013.01)

(58) Field of Classification Search
    CPC ...... G01M 3/165; G01M 3/186; G08B 21/20; C23C 16/4401; H01L 21/67109; H01L 21/67253; H01L 21/67017; H01L 21/67248
    See application file for complete search history.

(56)             References Cited

FOREIGN PATENT DOCUMENTS

| | | |
|---|---|---|
| KR | 20060063249 A | 6/2006 |
| KR | 20060083571 A | 7/2006 |
| KR | 101458132 B1 | 11/2014 |
| KR | 101901152 B1 | 9/2018 |

OTHER PUBLICATIONS

International Application Serial No. PCT/US2020/025048, International Search Report dated Jul. 24, 2020, 3 pgs.
International Application Serial No. PCT/US2020/025048, Written Opinion dated Jul. 24, 2020, 6 pgs.

\* cited by examiner

PROCESS COOLING-WATER ISOLATION

CLAIM OF PRIORITY

This application is a U.S. National Stage Filing under 35 U.S.C. 371 from international Application No. PCT/US2020/025048, filed on Mar. 26, 2020, and published as WO 2020/198521 A1 on Oct. 1, 2020, which claims the priority benefit to U.S. Patent Application Ser. No. 62/825,589, filed on 28 Mar. 2019, and entitled "PROCESS COOLING-WATER ISOLATION," each of which is incorporated by reference herein in its entirety.

TECHNICAL FIELD

The subject matter disclosed herein relates to various types of equipment used in the semiconductor and allied industries. More specifically, the disclosed subject matter relates to cooling and controlling of process cooling-water used within, for example, semiconductor process equipment.

BACKGROUND

Process cooling-water (PCW) is used in various types of semiconductor-process tools. Such tools can include various types of deposition tools (including plasma-based tools such as atomic-layer deposition (ALD), chemical vapor deposition (CVD), plasma-enhanced CVD (PECVD), etc.) and etching tools (e.g., reactive-ion etching (RIE) tools), as well as various types of thermal furnaces (e.g., such as rapid-thermal-annealing (RTA) furnaces and oxidation furnaces), ion implantation tools, and a variety of other process tools found in various fabrication environments in the semiconductor and related industries. These tools are known to a person of ordinary skill in the art. Most or all of these tools use water flowing within the tool to cool various components such as one or more plasma chambers, substrate-transfer mechanisms such as spindles, substrate-pedestal lift mechanisms, dielectric windows, electrostatic chucks, and various other components known to a person of ordinary skill in the art. Many of these components use a substantial amount of cooling water (e.g., a high flow-rate of about 76 lpm (approximately 20 gpm) at about 69 kPa differential pressure (approximately 10 psid)) flowing in proximity to or within the components. However, despite the substantial amount of water flowing within these tools, contemporaneous tools lack water-flow isolation upon leak detection and water back-flow prevention from a pressurized return-line.

Therefore, what is needed is a type of leak-detection system to detect leaking water and to trigger an alarm and shut down the water flowing in the system, thereby preventing damage to the process tool as well as preventing water from leaking into a fabrication environment in which the tool is installed.

Therefore, in various embodiments described herein, the disclosed subject matter describes an apparatus and system to enhance system safety by reducing the time required to isolate a water supply in the advent of a water leak in a tool, thereby preventing or significantly reducing the probability of potential flooding of customer fab.

The information described in this section is provided to offer the skilled artisan a context for the following disclosed subject matter and should not be considered as admitted prior art.

DETAILED DESCRIPTION

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps, construction techniques, or structures have not been described in detail so as not to obscure the disclosed subject matter.

The disclosed subject matter includes an apparatus and related method to prevent water flooding of a fabrication facility arising from an uncontrolled water leak from a water-cooling circuit installed within various tools. In general terms, the apparatus includes an isolation valve at an inlet of a cooling-water circuit, a check valve at an outlet of the cooling-water circuit, a water-leak sensor installed at one or more locations within the tool, and a control mechanism to (1) close the isolation valve when a leak is detected; and (2) keep the valve open when no leak is detected.

Various embodiments described herein enhance system safety by reducing the time required to isolate a water supply in the advent of a water leak in a tool (e.g., such as in a plasma-based processing tool, described below with reference to FIG. 1), thereby preventing or significantly reducing the probability of potential flooding of a fabrication environment in which the tool is located. For example, a double-acting (e.g., two-state control) valve prevents nuisance tripping and allows additional safety checks by, for example, various electronic devices, mechanical devices, software, or combinations thereof prior to opening or closing the water supply valve.

In various embodiments, an interlocking mechanism in, for example, software, using one or more digital outputs (DOs) and one or more digital inputs (DIs) to close the isolation valve upon receiving a signal from a water-leak sensor indicating a water leak; and open the isolation valve once any water leaks are repaired and no water-leak signal is received.

Figure 1:
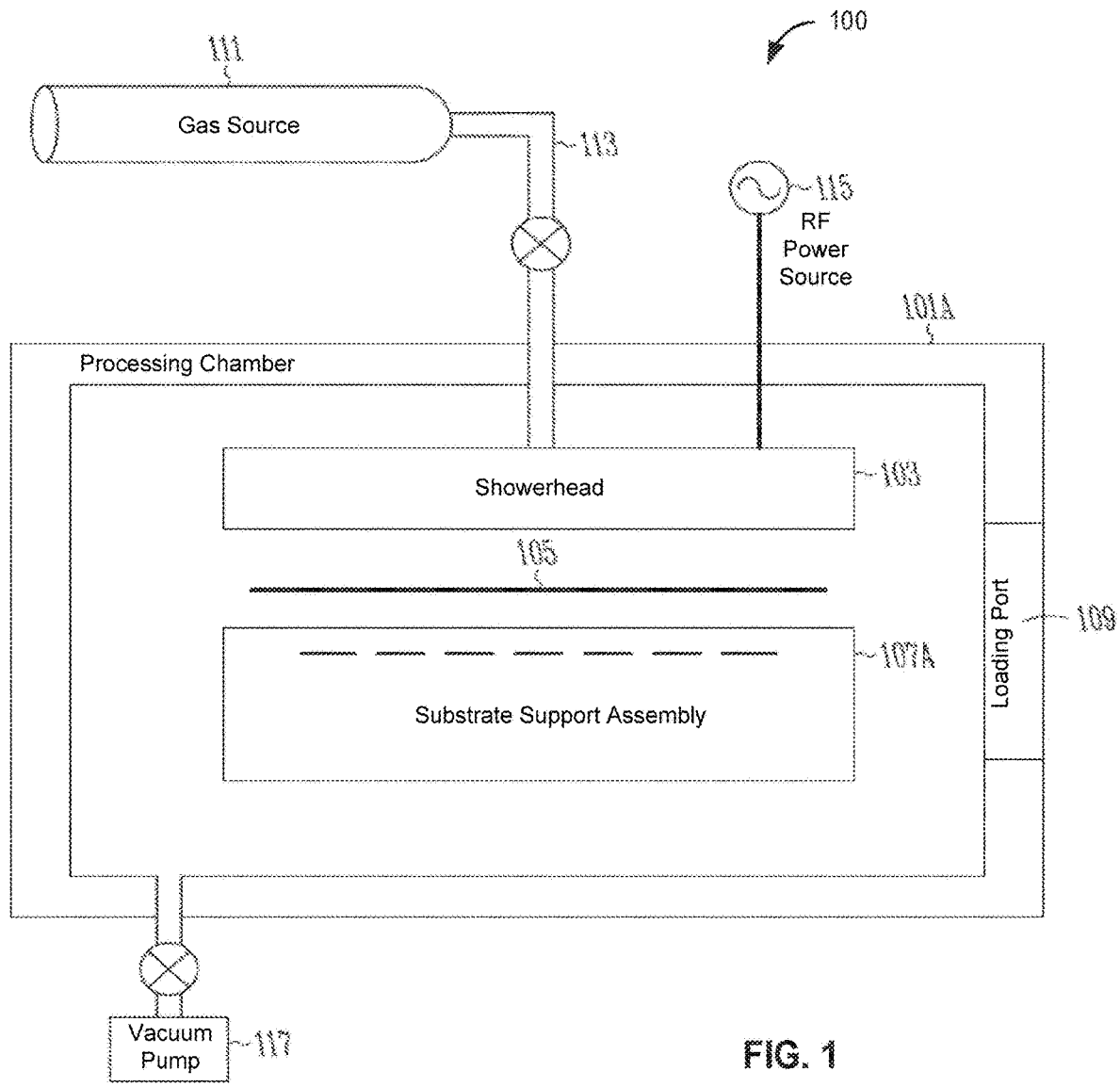
FIG. 1 shows a simplified example of a plasma-based processing chamber, which can include a substrate-support assembly comprising an electrostatic chuck (ESC), having water-cooled components that may be used with the disclosed subject matter.

With reference now to FIG. 1, a simplified example of a plasma-based processing tool 100 is shown. FIG. 1 is shown to include the plasma-based processing chamber 101A in which a showerhead electrode 103 and a substrate-support assembly 107A are disposed. Typically, the substrate-support assembly 107A provides a substantially-isothermal surface and may serve as both a heating element and a heat sink for a substrate 105. The substrate-support assembly 107A may comprise an ESC in which heating elements are included to aid in processing the substrate 105, as described above. As understood by a person of ordinary skill in the art, the substrate 105 may a wafer comprising elemental semiconductors (e.g., silicon or germanium), a wafer comprising compound elements (e.g., gallium arsenide (GaAs) or gallium nitride (GaN)), or variety of other substrate types known in the art (including conductive, semiconductive, and non-conductive substrates). The plasma-based processing chamber may have several water-cooled components that may be used with various embodiments of the disclosed subject matter.

In operation, the substrate 105 is loaded through a loading port 109 onto the substrate-support assembly 107A. A gas line 113 supplies one or more process gases to the showerhead electrode 103. In turn, the showerhead electrode 103 delivers the one or more process gases into the plasma-based processing chamber 101A. A gas source 111 to supply the one or more process gases is coupled to the gas line 113. An RF power source 115 is coupled to the showerhead electrode 103.

In operation, the plasma-based processing chamber 101A is evacuated by a vacuum pump 117. RF power is capacitively coupled between the showerhead electrode 103 and a lower electrode (not shown explicitly) contained within or on the substrate-support assembly 107A. The substrate-support assembly 107A is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. However, upon reading and understanding the disclosure provided herein, the person of ordinary skill in the art will recognize that a coil required to block or partially block a particular RF frequency can be designed as needed. Therefore, particular frequencies discussed herein are provided merely for ease in understanding. The RF power is used to energize the one or more process gases into a plasma in the space between the substrate 105 and the showerhead electrode 103. As is known in the relevant art, the plasma can assist in depositing various layers (not shown) on the substrate 105. In other applications, the plasma can be used to etch device features into the various layers on the substrate 105. As noted above, the substrate-support assembly 107A may have heaters (not shown) incorporated therein. The person of ordinary skill in the art will recognize that, while the detailed design of the plasma-based processing chamber 101A may vary, RF power is coupled through at least the substrate-support assembly 107A. Significantly, many of the components, as discussed in more detail below with reference to FIG. 2, within the plasma-based processing tool 100, rely on cooling water flowing therein to keep the components cool.

Figure 2:
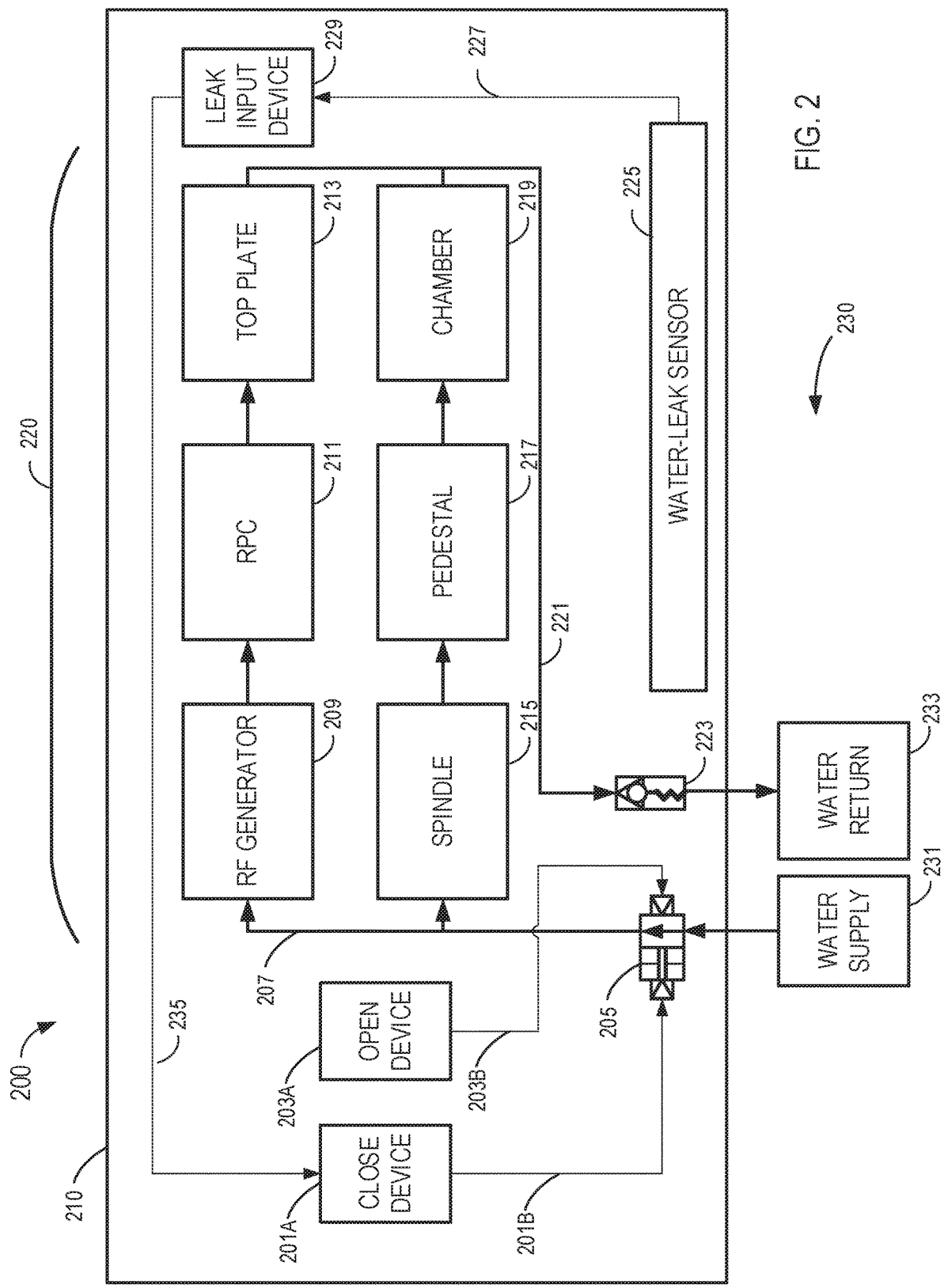
FIG. 2 shows an example of a process cooling-water isolation system in accordance with various embodiments of the disclosed subject matter.

FIG. 2 shows an example of a process cooling-water isolation system 200 in accordance with various embodiments of the disclosed subject matter. The process cooling-water isolation system 200 is shown to include portions of the disclosed subject matter that may typically be located within a process module 210 (or within a process tool, such as the plasma-based processing tool 100 of FIG. 1) that is located in, for example, a fabrication environment 230.

The process module 210 is shown to include a close device 201A, an open device 203A, an isolation valve 205, a water-leak sensor 225, and a water-leak sensor input module 229. A process-module water-cooling-circuit 220 includes a number of components that rely on water circulating therein in order to keep the component-s either cooled to a predetermined temperature or prevent the components from overheating. The process-module water-cooling-circuit 220 components include, for example, a radio-frequency (RF) generator 209, a remote plasma-chamber 211, a top plate 213 (e.g., a dielectric window), a spindle 215, a pedestal 217, and a process chamber 219. A person of ordinary skill in the art will recognize that not all process tools will necessarily include each of these components. Also, other tools may include many more components than are shown. Therefore, these components are shown merely for illustrative purposes and are not necessarily directly related to the disclosed subject matter. Consequently, these components may be grouped differently and in a different order than shown. For example, in one embodiment, rather than having two parallel cooling circuits having three components each linked in series, the components may all be linked to one another in series. In another embodiment, the components may be arranged in a series-parallel arrangement, In other embodiments, each of the components may be coupled to receive process cooling-water directly from the isolation valve 205 (in this embodiment, the components are arranged in parallel with one another).

Figure 4:
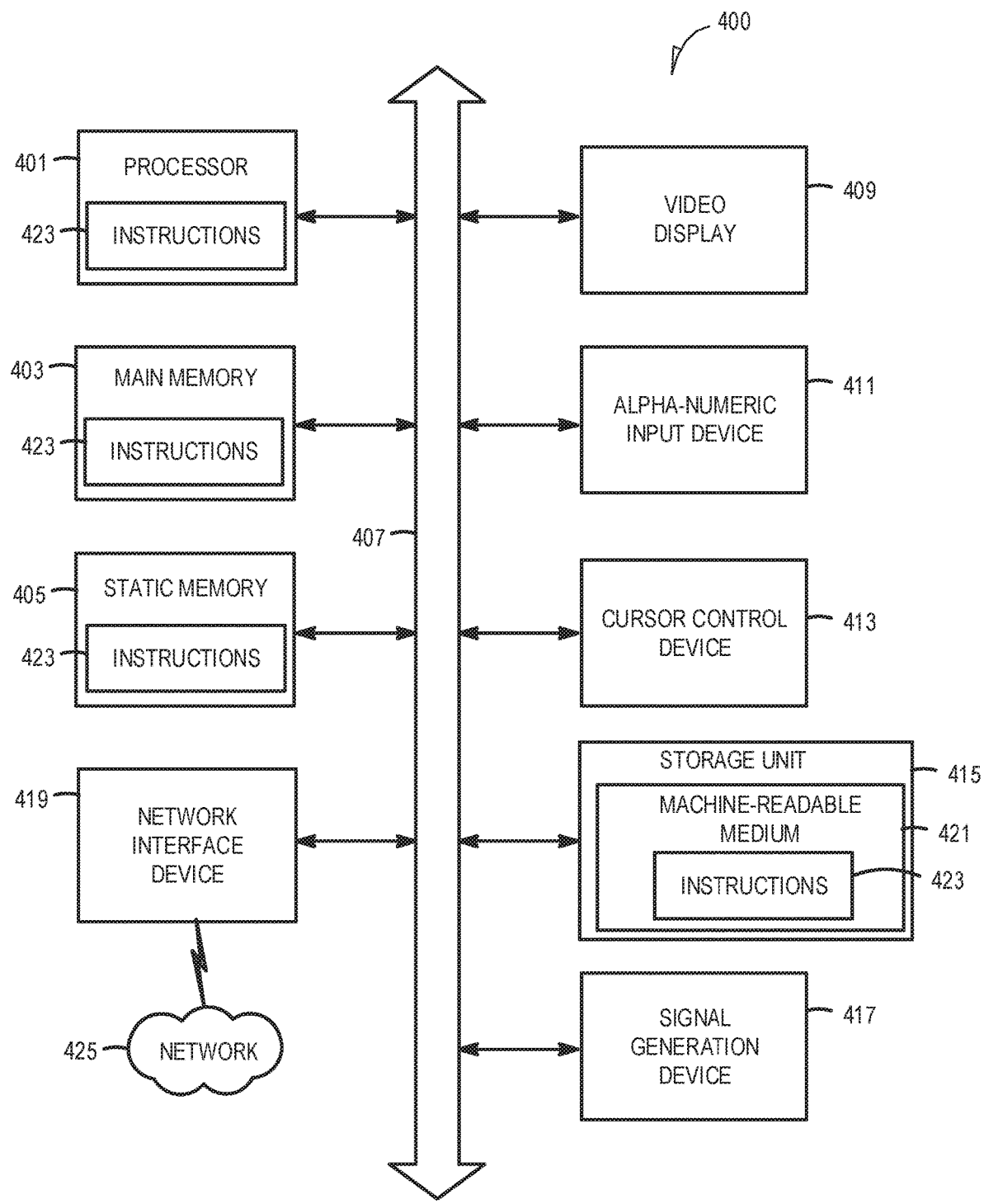
FIG. 4 shows a simplified block diagram of a machine in an example form of a computing system within which a set of instructions for causing the machine to perform any one or more of the methodologies and operations discussed herein may be executed.

In various embodiments, the open device 203A, the close device 201A, and the water-leak sensor input module 229 may comprise one or more various types of electrical, mechanical, or hybrid electrical-mechanical components. For example, the open device 203A, the close device 201A, and the water-leak sensor input module 229 may comprise an application-specific integrated circuit (ASIC), a finite-state machine, a controller or other microprocessor (or group of microprocessors), a stand-alone computer, or various other electrical and/or mechanical components as described below in more detail with reference to FIG. 4. FIG. 4 also provides details on how each of these devices may be controlled by software.

In various embodiments, the water-leak sensor 225 may rely on electrical conductivity of water to decrease the resistance across two contact points, although a person of ordinary skill in the art, upon reading and understanding the disclosed subject matter, will recognize other types of techniques to devise the water-leak sensor 225. Further, although shown as a separate component, the water-leak sensor 225 may comprise multiple instantiations of the water-leak sensor 225. For example, the water-leak sensor 225 may be located within or near each of the components within the process-module water-cooling-circuit 220 (e.g., such as in the RF generator 209, the pedestal 217, the process chamber 219, and the process module 210), with a water-leak sensor 225 at one or more locations within each of the aforementioned locations. A person of ordinary skill in the art will recognize that the one or more sensors may be placed at, for example, a lowermost portion of the various components such that gravity will assist water leaked within the components to be sensed by the water-leak sensor 225 quickly. However, such a location placement is not necessary. For example, the water-leak sensor 225 may be placed in proximity to a location where leaked water may be most quickly sensed, such as directly near a water coupling point of the various components (such coupling points are not shown explicitly but are understood by a skilled artisan).

In various embodiments, the water-leak sensor 225 may comprise a water-sensitive cable, which can be laid in long lengths and complex patterns in and around (e.g., in proximity to) any of one or more selected components within the process module 210. Therefore, in these embodiments, the water-leak sensor 225 can thread around some or all of the components such that it can sense a leak at one or more locations.

Upon reading and understanding the disclosed subject matter, a person of ordinary skill in the art will recognize that many of the components shown as being located within the process module 210 could actually be located in the fabrication environment 230. Alternatively, many of the components shown as being located within the fabrication environment 230 could be located within the process module 210. For example, one or more of the close device 201A, the open device 203A, and the water-leak sensor input module 229 could be located in a computer or a group of processors that are located remotely from the process cooling-water isolation system 200 in the fabrication environment 230. In other embodiments, one or more of the close device 201A, the open device 203A, and the water-leak sensor input module 229 could be located in a computer or a group of processors that are located in a remote location outside of the fabrication environment 230.

During an operation of the process cooling-water isolation system 200, the open device 203A sends a signal via a communications line 203B to the isolation valve 205, thereby opening the isolation valve 205 and allowing process cooling-water to flow from a water supply 231 via a water line 207 into each of the components within the process-module water-cooling-circuit 220. A water-return line 221 then allows return-water flow to traverse a check valve 223 to a water-return reservoir 233 in the fabrication environment 230. In various embodiments, the water-return reservoir 233 may comprise a waste or drain within the fabrication environment 230. If a water leak is sensed by the water-leak sensor 225, the water-leak sensor 225 sends a signal via a leak-sensed communication line 227 to the water-leak sensor input module 229. In turn, the water-leak sensor input module 229 sends a signal to the close device 201A via communications line 235. The close device 201A substantially immediately sends a signal, via the communications line 203B to the isolation valve 205, which closes an internal valve within the isolation valve 205 preventing any water from entering the water line 207. In other embodiments (not shown explicitly but understandable to a person of ordinary skill in the art), the water-leak sensor 225 may send a signal directly to the close device 201A.

Upon reading and understanding the disclosed subject matter, a person of ordinary skill in the art will recognize that each of the close device 201A, the open device 203A, and the water-leak sensor input module 229 may comprise portions of a common electrical and/or mechanical module or device. The skilled artisan will further recognize that one or more of the various communication lines may be substituted by, or used in conjunction with, a wireless signal.

In a specific exemplary embodiment, the isolation valve 205 comprises a double-acting valve with two inputs (open and close). One type of valve that may be suitable for the isolation valve 205 is an SMC, VNB Series 2 Port valve, model number VNB403CS-N25A (available from SMC Corporation, Sotokanda, Chiyoda-ku, Tokyo 101-0021, Japan and SMC USA, 10100 SMC Blvd, Noblesville, Indiana, USA). Upon reading and understanding the disclosed subject matter, a person of ordinary skill in the art will recognize numerous other types of valves that may be suitable for the isolation valve 205. In an embodiment where the close device 201A and the open device 203A are, for example, electronic devices, such as a microprocessor or controller, the isolation valve 205 may be triggered to a closed position or an open position by a digital out (DO) signal on the communications lines 201B, 203B, respectively. Further, in various embodiments, a person of ordinary skill in the art will recognize that one or more of the communications lines 201B, 203B, 227, 235 may at least partially comprise an electrical trace within a microprocessor or controller, or within, for example, a printed circuit board that includes the microprocessor or controller coupled in proximity to the isolation valve 205 and/or the check valve 223.

The check valve 223 (also referred to as a non-return valve) allows fluid (in this situation, water) to flow in only one direction—from the process-module water-cooling-circuit 220, to the water-return reservoir 233. Generally, the check valve 223 may be considered to be a two-port valve—one port for water to enter the check valve 223 (from the process-module water-cooling-circuit 220) and the second port for water to leave the check valve 223 (to the water-return reservoir 233). Consequently, once the isolation valve is in a closed position, water can no longer enter into the process-module water-cooling-circuit 220. For example, with the isolation valve 205 closed, there is no water pressure in, for example, the water line 207 or the water-return line 221. Therefore, due to potentially higher pressure in the water-return reservoir 233, water could flow in reverse (e.g., a back-flow condition) from the water-return reservoir 233 into the water-return line 221 toward the water line 207. In this case, even though the isolation valve 205 is closed, the water will flow within the process module 210 and the isolation valve, by itself, will fail to mitigate a leak situation. The check valve 223 prevents such a reverse water-flow and leak condition.

In a specific exemplary embodiment, the check valve 223 may be selected to have a cracking pressure of greater than about 6.9 kPa (approximately 1 psi). The cracking pressure is the inlet pressure at which water can flow through the check valve 223. When the cracking pressure is reached, the check valve 223 opens, thereby allowing flow of the water from the water-return line 221 to the water-return reservoir 233. When the water pressure drops to less than 6.9 kPa in this embodiment, the check valve 223 automatically closes (e.g., due to spring pressure within the valve). One type of valve that may be suitable for the check valve 223 is a Swagelok® CH Series, model number SS-CHS16-1 valve (available from Swagelok Company of Solon, Ohio, USA). In this specific exemplary embodiment, the check valve 223 is a spring-loaded poppet-style valve with a bonded elastomer seal, having a high flow-rate of about 76 lpm (approximately 20 gpm) at about 69 kPa differential pressure (approximately 10 psid). Upon reading and understanding the disclosed subject matter, a person of ordinary skill in the art will recognize numerous other types of valve that may be suitable for the check valve 223.

Upon reading and understanding the disclosed subject matter, a person of ordinary skill in the art will recognize that various other embodiments may be used to accomplish to implement the process cooling-water isolation apparatus and techniques described herein. For example, one or both of the isolation valve 205 and the check valve 223 may be either pneumatically operated or hydraulically operated. In these embodiments, one or more of the related communications lines 201B, 203B, 227, 235 may comprise tubing to transport gas (e.g., air) or a hydraulic fluid to or from various ones on the interconnected components. Each of these additional embodiments is within a scope of the disclosed subject matter.

Figure 3:
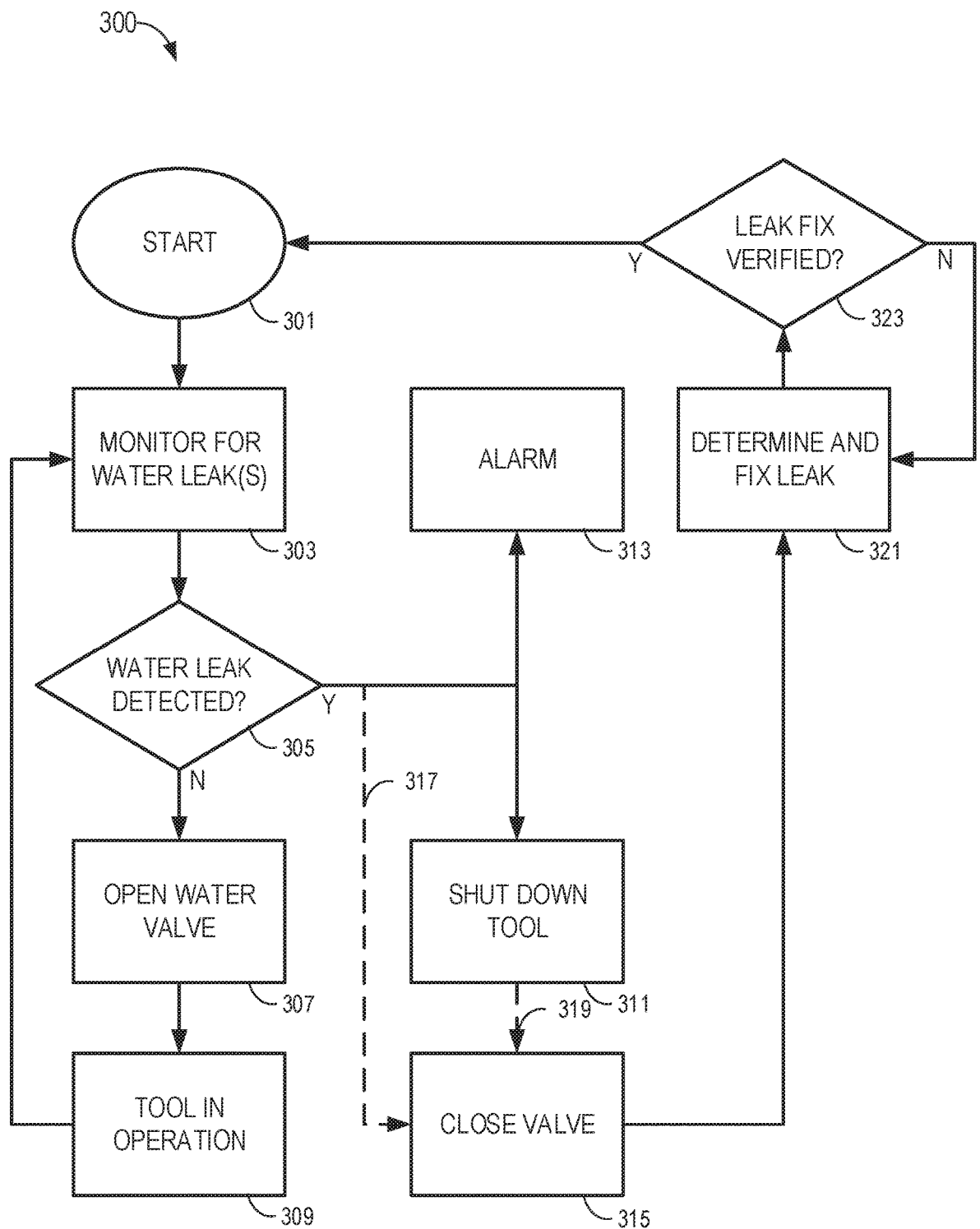
FIG. 3 shows an example of a method of operating a process cooling-water isolation system in accordance with various embodiments of the disclosed subject matter.

FIG. 3 shows an example of a method 300 of operating a process cooling-water isolation system in accordance with various embodiments of the disclosed subject matter. With concurrent reference to FIG. 2, the method 300 begins at operation 301. At operation 303, the process cooling-water isolation system 200 is monitored for leaks as sensed by the water-leak sensor 225. If no water leak is detected at operation 305, a signal is sent from the open device 203A to the isolation valve 205 at operation 307 to open the isolation valve 205 and allow water to flow (or continue to leave the valve open if previously opened). The tool is in operation (or continues in operation) at operation 309 while the method 300 loops back to operation 303 to continue monitoring, substantially continuously, for leaks within the process cooling-water isolation system 200.

If a determination is made at operation 305 that a water leak is detected, at least two possible paths may be followed. In a first optional path, the tool is shut down at operation 311 while substantially simultaneously sounding an alarm at operation 313 to alert an operator of the tool (e.g., a process engineer) of the leak condition. Once the tool is shut down at operation 311, a first optional path 319 is followed to close the isolation valve 205 at operation 315. With no incoming water, the check valve 223 within the process cooling-water isolation system 200 then closes automatically (e.g., by internal spring pressure) to prevent water from back-flowing from the water-return reservoir 233 as described above with reference to FIG. 2.

Referring back to operation 305, if a determination is made that a water leak is detected, in a second path, the tool is shut down at operation 311, while substantially simultaneously sounding an alarm at operation 313 and closing the isolation valve 205 at operation 315 as noted by the second path 317. Consequently, in this second optional path, the tool is shut down, the alarm is sounded, and the isolation valve 205 is closed, all substantially concurrently and all in substantially real time As with the first optional path, the check valve 223 within the process cooling-water isolation system 200 then automatically prevents water from back-flowing from the water-return reservoir 233 as described above with reference to FIG. 2.

Once the isolation valve 205 is closed at operation 315, a determination is made at operation 321 (e.g., by the process engineer) of a location (or locations) of the leak within the process cooling-water isolation system 200. Once the leak (or leaks) are repaired, a determination is made at operation 323 whether the one or more leaks is repaired. Such a leak verification may be performed by, for example, a visual inspection of all components within the process cooling-water isolation system 200 prior to the tool being returned to full operation. If a determination is made at operation 323 that at least one leak is still not repaired, another determination is made at operation 321 where the at least one more leak is occurring and the at least one leak is repaired. Another determination is made at operation 323 whether the one or more leaks is repaired. Once a determination is made at operation 323 that all leaks are repaired, the operation resumes at operation 301.

Referring now to FIG. 4, a block diagram illustrating components of a machine 400, according to some embodiments, able to read instructions from a machine-readable medium e.g., a non-transitory machine-readable medium, a machine-readable storage medium, a computer-readable storage medium, or any suitable combination thereof) and perform any one or more of the methodologies discussed herein is shown. Specifically, FIG. 4 shows a diagrammatic representation of the machine 400 in the example form of a computer system and within which instructions 424 (e.g., software, a program, an application, an applet, an app, or other executable code) for causing the machine 400 to perform any one or more of the methodologies discussed herein may be executed.

In alternative embodiments, the machine 400 operates as a standalone device or may be connected (e.g., networked) to other machines. In a networked deployment, the machine 400 may operate in the capacity of a server machine or a client machine in a server-client network environment, or as a peer machine in a peer-to-peer (or distributed) network environment. The machine 400 may be a server computer, a client computer, a personal computer (PC), a tablet computer, a laptop computer, a netbook, a set-top box (STB), a personal digital assistant (PDA), a cellular telephone, a smartphone, a web appliance, a network router, a network switch, a network bridge, or any machine capable of executing the instructions 424, sequentially or otherwise, that specify actions to be taken by that machine. Further, while only a single machine is illustrated, the term "machine" shall also be taken to include a collection of machines that individually or jointly execute the instructions 424 to perform any one or more of the methodologies discussed herein.

The machine 400 includes a processor 402 (e.g., a central processing unit (CPU), a graphics processing unit (GPU), a digital signal processor (DSP), an application specific integrated circuit (ASIC), a radio-frequency integrated circuit (RFIC), or any suitable combination thereof), a main memory 404, and a static memory 406, which are configured to communicate with each other via a bus 408. The processor 402 may contain microcircuits that are configurable, temporarily or permanently, by some or all of the instructions 424 such that the processor 402 is configurable to perform any one or more of the methodologies described herein, in whole or in part. For example, a set of one or more microcircuits of the processor 402 may be configurable to execute one or more electronic devices or other modules (e.g., software modules) described herein.

The machine 400 may further include a graphics display 410 (e.g., a plasma display panel (PDP), a light emitting diode (LED) display, a liquid crystal display (LCD), a projector, or a cathode ray tube (CRT)). The machine 400 may also include an alpha-numeric input device 412 (e.g., a keyboard), a cursor control device 414 (e.g., a mouse, a touchpad, a trackball, a joystick, a motion sensor, or other pointing instrument), a storage unit 416, a signal generation device 418 (e.g., a speaker), and a network interface device 420.

The storage unit 416 includes a machine-readable medium 422 (e.g., a tangible and/or non-transitory machine-readable storage medium) on which is stored the instructions 424 embodying any one or more of the methodologies or functions described herein. The instructions 424 may also reside, completely or at least partially, within the main memory 404, within the processor 402 (e.g., within the processor's cache memory), or both, during execution thereof by the machine 400. Accordingly, the main memory 404 and the processor 402 may be considered as machine-readable media (e.g., tangible and/or non-transitory machine-readable media). The instructions 424 may be transmitted or received over a network 426 via the network interface device 420. For example, the network interface device 420 may communicate the instructions 424 using any one or more transfer protocols (e.g., hypertext transfer protocol (HTTP)).

In some embodiments, the machine 400 may be a portable computing device, such as a smart phone or tablet computer, and have one or more additional input components (e.g., sensors or gauges). Examples of such additional input components include an image input component (e.g., one or more cameras), an audio input component (e.g., a microphone), a direction input component (e.g., a compass), a location input component (e.g., a global positioning system (GPS) receiver), an orientation component (e.g., a gyroscope), a motion detection component (e.g., one or more accelerometers), an altitude detection component (e.g., an altimeter), and a gas detection component (e.g., a gas sensor). Inputs harvested by any one or more of these input components may be accessible and available for use by any of the modules described herein.

As used herein, the term "memory" refers to a machine-readable medium able to store data temporarily or permanently and may be taken to include, but not be limited to, random-access memory (RAM), read-only memory (ROM), buffer memory, flash memory, and cache memory. While the machine-readable medium 422 is shown in an embodiment to be a single medium, the term "machine-readable medium" should be taken to include a single medium or multiple media (e.g., a centralized or distributed database, or associated caches and servers) able to store instructions. The term "machine-readable medium" shall also be taken to include any medium, or combination of multiple media, that is capable of storing instructions for execution by a machine (e.g., the machine 400), such that the instructions, when executed by one or more processors of the machine (e.g., the processor 402), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more tangible (e.g., non-transitory) data repositories in the form of a solid-state memory, an optical medium, a magnetic medium, or any suitable combination thereof.

Furthermore, the machine-readable medium is non-transitory in that it does not embody a propagating signal. However, labeling the tangible machine-readable medium as "non-transitory" should not be construed to mean that the medium is incapable of movement—the medium should be considered as being transportable from one physical location to another. Additionally, since the machine-readable medium is tangible, the medium may be considered to be a machine-readable device.

The instructions 424 may further be transmitted or received over a network 426 (e.g., a communications network) using a transmission medium via the network interface device 420 and utilizing any one of a number of well-known transfer protocols (e.g., HTTP). Examples of communication networks include a local area network (LAN), a wide area network (WAN), the Internet, mobile telephone networks, POTS networks, and wireless data networks (e.g., WiFi and WiMAX networks). The term "transmission medium" shall be taken to include any intangible medium that is capable of storing, encoding, or carrying instructions for execution by the machine, and includes digital or analog communications signals or other intangible medium to facilitate communication of such software.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A "hardware module" is a tangible unit capable of performing certain operations and may be configured or arranged in a certain physical manner. In various embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field programmable gate array (FPGA) or an ASIC. A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a processor, for example, to constitute a particular hardware-module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the one or more processors, not only residing within a single machine, but deployed across a number of machines. In some embodiments, the one or more processors or processor-implemented modules may be located in a single geographic location (e.g., within a home environment, an office environment, or a server farm). In other embodiments, the one or more processors or processor-implemented modules may be distributed across a number of geographic locations.

Overall, the disclosed subject matter contained herein describes or relates generally to isolation of process cooling-water used with operations of tools in a semiconductor fabrication environment (fabrication). Such tools can include various types of deposition tools (including plasma-based tools such as atomic-layer deposition (ALD), chemical vapor deposition (CVD), plasma-enhanced CVD (PECVD), etc.) and etching tools (e.g., reactive-ion etching (RIE) tools), as well as various types of thermal furnaces (e.g., such as rapid-thermal-annealing (RTA) furnaces and oxidation furnaces), ion implantation tools, and a variety of other process tools found in various fabs and known to a person of ordinary skill in the art. However, the disclosed subject matter is not limited to semiconductor environments and can be used in a number of machine-tool environments such as manufacturing and machining environments (e.g., including those operations using physical vapor deposition (PVD tools)), as well as a variety of other environments. Upon reading and understanding the disclosure provided herein, a person of ordinary skill in the art will recognize that various embodiments of the disclosed subject matter may be used with other types of process tools as well as a wide variety of other tools, equipment, and components.

As used herein, the term "or" may be construed in an inclusive or exclusive sense. Further, other embodiments will be understood by a person of ordinary skill in the art upon reading and understanding the disclosure provided.

Further, upon reading and understanding the disclosure provided herein, the person of ordinary skill in the art will readily understand that various combinations of the techniques and examples provided herein may all be applied in various configurations.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Further, functionally equivalent methods and devices within the scope of the disclosure, in addition to those enumerated herein, will be apparent to the skilled artisan from the foregoing descriptions. Portions and features of some embodiments, materials, and construction techniques may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A process cooling-water isolation system used in a process tool, the system comprising:
    an isolation valve having an inlet port and an outlet port, the inlet port is configured to be coupled to a water supply, and the outlet port is configured to be coupled to an inlet of one or more components in a process-module water-cooling circuit;
    an open device coupled to the isolation valve to open the isolation valve to allow coding water to flow to the one or more components in the process-module water-coding circuit;
    a dose device coupled to the isolation valve to dose the isolation valve to prevent coding water from flowing to the one or more components in the process-module water-coding circuit;
    at least one water-leak sensor coupled to the dose device, the at least one water-leak sensor to detect a water leak within the process tool; and
    a check valve having an inlet port and an outlet port, the inlet port configured to be coupled to an outlet of one or more components in the process-module water-coding circuit, the outlet port configured to be coupled to a water-return reservoir, the check valve to prevent water from back-flowing from the water-return reservoir into the one or more components in the process-module water-cooling circuit.

2. The process cooling-water isolation system of claim 1, further comprising a water-leak sensor input module disposed between the water-leak sensor and the close device, the water-leak sensor input module to receive a signal from the at least one water-leak sensor and transmit the signal to the close device to close the isolation valve.

3. The process cooling-water isolation system of claim 1, wherein the at least one water-leak sensor includes multiple instantiations in each of the one or more components in the process-module water-cooling circuit.

4. The process cooling-water isolation system of claim 1, wherein the at least one water-leak sensor comprises a water-sensitive cable formed in proximity to at least some of the one or more components in the process-module water-cooling circuit.

5. The process cooling-water isolation system of claim 1, wherein the check valve has a cracking pressure of greater than about 6.9 kRa.

6. The process cooling-water isolation system of claim 1, wherein the one or more components in the process-module water-cooling circuit includes at least one component selected from components including a radio-frequency generator, a remote plasma-chamber, a top plate, a spindle, a pedestal, and a chamber.

7. The process cooling-water isolation system of claim 1, wherein the one or more components in the process-module water-cooling circuit are arranged in series with one another.

8. The process cooling-water isolation system of claim 1, wherein the one or more components in the process-module water-cooling circuit are arranged in parallel with one another.

9. The process coding-water isolation system of claim 1, wherein the one or more components in the process-module water-cooling circuit are arranged in a series-parallel arrangement with one another.

10. The process cooling-water isolation system of claim 1, wherein the open device, the dose device, and the isolation valve are coupled to one another electrically.

11. The process coding-water isolation system of claim 1, wherein the open device, the dose device, and the isolation valve are coupled to one another pneumatically.

12. The process coding-water isolation system of claim 1, wherein the open device, the dose device, and the isolation valve are coupled to one another hydraulically.

13. The process coding-water isolation system of claim 1, wherein the one or more components in the process-module water-cooling circuit are contained within a process module of the process tool.

14. A method of operating a process cooling-water isolation system for a process tool, the method comprising:
monitoring for a water leak within the process tool;
based on a determination that a water leak has been detected:
shutting down the process tool;
sounding an alarm; and
closing a double-acting isolation valve supplying cooling water to the process tool by operating a close input of the double-acting isolation valve using a close device coupled to the close input of the double-acting isolation valve;
based on a determination that a water leak has not been detected:
selecting from (i) opening the isolation valve by operating an open input of the double-acting isolation valve using an open device coupled to the open input of the double-acting isolation valve and (ii) continuing to leave the valve open if previously opened; and
continuing to monitor for water leaks.

15. The method of claim 14, further comprising, based on the determination that the water leak has occurred:
determining one or more locations where the leak has occurred; and
repairing the leak.

16. The method of claim 15, further comprising:
verifying that the leak has been repaired; and
based on a determination that the leak has been repaired, continuing to monitor for water leaks within the process tool.

17. A machine-readable storage medium storing a set of instructions that, when executed by a machine, cause the machine to perform operations for operating a process cooling-water isolation system for a process tool, the operations comprising:
monitoring for a water leak within the process tool;
based on a determination that a water leak has been detected:
shutting down the process tool;
sounding an alarm; and
closing a double-acting isolation valve supplying cooling water to the process tool by operating a close input of the double-acting isolation valve using a close device coupled to the close input of the double-acting isolation valve;
based on a determination that a water leak has not been detected:
selecting from (i) opening the isolation valve by operating an open input of the double-acting isolation valve using an open device coupled to the open input of the double-acting isolation valve and (ii) continuing to leave the valve open if previously opened; and
continuing to monitor for water leaks.

18. The method of claim 14 further comprising preventing water from back-flowing from a water-return reservoir into a process-module water-cooling circuit using a check valve connected to the water-return reservoir and the process-module water-cooling circuit.

19. The machine-readable storage medium of claim 17 wherein the operations further comprise preventing water from back-flowing from a water-return reservoir into a process-module water-cooling circuit using a check valve connected to the water-return reservoir and the process-module water-cooling circuit.

* * * * *